US012321229B2

(12) United States Patent
McCrate et al.

(10) Patent No.: US 12,321,229 B2
(45) Date of Patent: Jun. 3, 2025

(54) BURST CORRECTION REED SOLOMON DECODING FOR MEMORY APPLICATIONS

(71) Applicant: Micron Technology, Inc., Boise, ID (US)

(72) Inventors: Joseph M. McCrate, Boise, ID (US); Kirthi Shenoy, Boise, ID (US); Marco Sforzin, Boise, ID (US); Brian M. Twait, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/415,632

(22) Filed: Jan. 17, 2024

(65) Prior Publication Data
US 2024/0272981 A1 Aug. 15, 2024

Related U.S. Application Data

(60) Provisional application No. 63/480,175, filed on Jan. 17, 2023, provisional application No. 63/480,183, filed on Jan. 17, 2023.

(51) Int. Cl.
*G06F 11/10* (2006.01)
*H03M 13/15* (2006.01)
*H03M 13/37* (2006.01)

(52) U.S. Cl.
CPC ...... *G06F 11/1016* (2013.01); *G06F 11/1004* (2013.01); *G06F 11/1044* (2013.01); *G06F 11/1068* (2013.01); *G06F 11/1072* (2013.01); *H03M 13/1575* (2013.01); *H03M 13/373* (2013.01)

(58) Field of Classification Search
None
See application file for complete search history.

(56) References Cited

U.S. PATENT DOCUMENTS

| 10,998,922 | B2 * | 5/2021 | Koike-Akino | .... H03M 13/2906 |
| 11,467,760 | B1 * | 10/2022 | Avron | ..... G06F 11/10 |
| 2014/0122974 | A1 * | 5/2014 | Yun | ..... G06F 11/1048 |
| | | | | 714/773 |

(Continued)

OTHER PUBLICATIONS

C. K. Matcha and S. Garani Srinivasa, "Defect Detection and Burst Erasure Correction for TDMR," in IEEE Transactions on Magnetics, vol. 52, No. 11, pp. 1-11, Nov. 2016, Art No. 3101211, (Year: 2016) (Year: 2016).*

(Continued)

*Primary Examiner* — Daniel F. McMahon

(57) ABSTRACT

Provided is an apparatus comprising a search engine configured to (i) receive parallel input of a set of syndrome polynomial products corresponding to a set of ECC words and (ii) produce corresponding sets of polynomial roots therefrom and a sequence detector configured to identify sequences within each of the polynomial roots within the set of roots. Also provided is sequence check logic for (i) combining the identified sequences within each of the polynomial roots and (ii) performing a sequence check of the combined identified sequences to determine whether only one of the identified sequences if valid; and an error location generator to derive an error location in each of the ECC words within the set responsive to the valid sequence.

20 Claims, 8 Drawing Sheets

(56) References Cited

U.S. PATENT DOCUMENTS

| | | | |
|---|---|---|---|
| 2014/0245104 A1* | 8/2014 | Song | H03M 13/618 |
| | | | 714/762 |
| 2017/0269997 A1* | 9/2017 | Suzuki | G11C 29/42 |
| 2021/0019225 A1* | 1/2021 | Oh | G06F 11/1048 |
| 2021/0373995 A1* | 12/2021 | Shin | G06F 11/1048 |
| 2022/0189574 A1* | 6/2022 | Amato | G11C 29/44 |
| 2022/0261310 A1* | 8/2022 | Ishikawa | G06F 11/1068 |
| 2024/0223306 A1* | 7/2024 | Tullberg | H03M 13/3715 |

OTHER PUBLICATIONS

M. N. Kaynak, T. M. Duman and E. M. Kurtas, "Burst error identification for turbo- and LDPC-coded magnetic recording systems," in IEEE Transactions on Magnetics, vol. 40, No. 4, pp. 3087-3089, Jul. 2004, (Year: 2004) (Year: 2004).*

* cited by examiner

BURST CORRECTION REED SOLOMON DECODING FOR MEMORY APPLICATIONS

CROSS-REFERENCE TO RELATED APPLICATIONS

This application claims benefit to U.S. Provisional Patent Application Nos. 63/480,175 and 63/480,183, both filed Jan. 17, 2023, the disclosures of which are incorporated herein in their entirety, by reference.

FIELD OF TECHNOLOGY

The following relates generally to improving reliability, availability, and serviceability (RAS) in memory devices. In particular, the disclosure relates to improved error correction code (ECC) techniques for detecting and correcting errors due to memory device failures.

BACKGROUND

Memory devices (e.g., memory media devices) are widely used to store information in various electronic devices such as computers, user devices, wireless communication devices, cameras, digital displays, and the like. Information is stored by programing memory cells within a memory device to various states. For example, binary memory cells may be programmed to one of two supported states, often corresponding to a logic 1 or a logic 0.

In some examples, a single memory cell may support more than two possible states, any one of which may be stored by the memory cell. To access information stored by a memory device, a component may read, or sense, the state of one or more memory cells within the memory device. To store information, a component may write, or program, one or more memory cells within the memory device to corresponding states.

Various types of memory devices exist, including magnetic hard disks, random access memory (RAM), read-only memory (ROM), dynamic random access memory (DRAM), synchronous dynamic RAM (SDRAM), static RAM (SRAM), flash memory, and others. Memory devices may be volatile or non-volatile. Volatile memory cells (e.g., DRAM cells) may lose their programmed states over time unless they are periodically refreshed by an external power source. SRAM memory cells may maintain their programmed states for the duration of the system being powered on. Non-volatile memory cells (e.g., Not And (NAND) memory cells) may maintain their programmed states for extended periods of time even in the absence of an external power source.

Many memory devices comprise multiple memory components. For example, a single read or write operation from a memory controller transfers data from or to multiple memory components in parallel. Thus, a single access may comprise data stored across multiple memory devices.

Compute express link (CXL) DRAM memory devices generally require high RAS. One key reliability consideration is achieving a low annualized failure rate (AFR) and silent data corruption (SDC) rate. As known in the art, SDC occurs when a processor inadvertently corrupts the data it processes but the rest of the system is unaware of the inadvertent corruption. Lower AFRs may be achieved using ECC techniques capable of detecting and correcting errors due to failure of an entire memory component. However, these techniques can be costly in terms of parity bit requirements. These techniques are commonly known to those of skill in the art as chipkill.

ECC techniques that cannot detect and correct an entire device failure (although rare) risk generating uncorrectable errors (UEs) when a single device fails. Other failure modes (e.g., single row failure) may corrupt all data in a single read access (pre-fetch) but data in most devices are still valid. ECC techniques that cannot detect and correct all bits in any given read from a single device are at risk for generating UEs from these failure modes. Access corrupting fail modes are believed to be more common than entire die fail modes and, therefore, represent the more likely reliability risk.

BRIEF DESCRIPTION OF THE DRAWINGS

Illustrative embodiments may take form in various components and arrangements of components. Illustrative embodiments are shown in the accompanying drawings, throughout which like reference numerals may indicate corresponding or similar parts in the various drawings. The drawings are only for purposes of illustrating the embodiments and are not to be construed as limiting the disclosure. Given the following enabling description of the drawings, the novel aspects of the present disclosure should become evident to a person of ordinary skill in the relevant art(s).

DETAILED DESCRIPTION

While the illustrative embodiments are described herein for particular applications, it should be understood that the present disclosure is not limited thereto. Those skilled in the art and with access to the teachings provided herein will recognize additional applications, modifications, and embodiments within the scope thereof and additional fields in which the present disclosure would be of significant utility.

Embodiments of the present disclosure provide ECC solutions (e.g., single-pass techniques) that can correct up to an entire device failure in a cacheline. In one exemplary solution, two codewords are constructed from a single cacheline, with the first codeword having sufficient parity to correct a single device with random error correction and the second not. Error locations from the first codeword are used to mark erasures in the second codeword, enabling correction of a single device in both codewords.

One exemplary embodiment uses a similar codeword construction approach but uses a collaborative interleaved Reed-Solomon (IRS) decoding technique to enable beyond half-minimum distance bounds correction. This solution, for example, improves decoding failures (e.g., uncorrectable errors (UEs)) and offers potentially lower SDC probabilities and/or mis-correction probabilities in comparison to conventional multi-pass or multiple decoding attempt (e.g., erasure search) approaches. The embodiments also provide single-pass adjacent symbol BEC solutions for RS codes. Adjacent symbol BEC is fundamental to single device or single-pass techniques because errors in multiple symbols from a single device may be considered a type of burst error.

These solutions offer improved performance (e.g., reduced latencies) in comparison to multi-pass approaches. The improvements largely result from several concepts. The number and complexity of the equations to calculate the error locations is reduced by leveraging an assumption that the errors are located in adjacent symbols. Additionally, more errors can be corrected using the same amount of parity. Finally, the inventors recognize that a sequence of adjacent bit errors contained in a single symbol can be corrected for the same cost as a single bit error in that symbol. Details of these solutions are provided in the sections (and corresponding figures) below.

Figure 1:
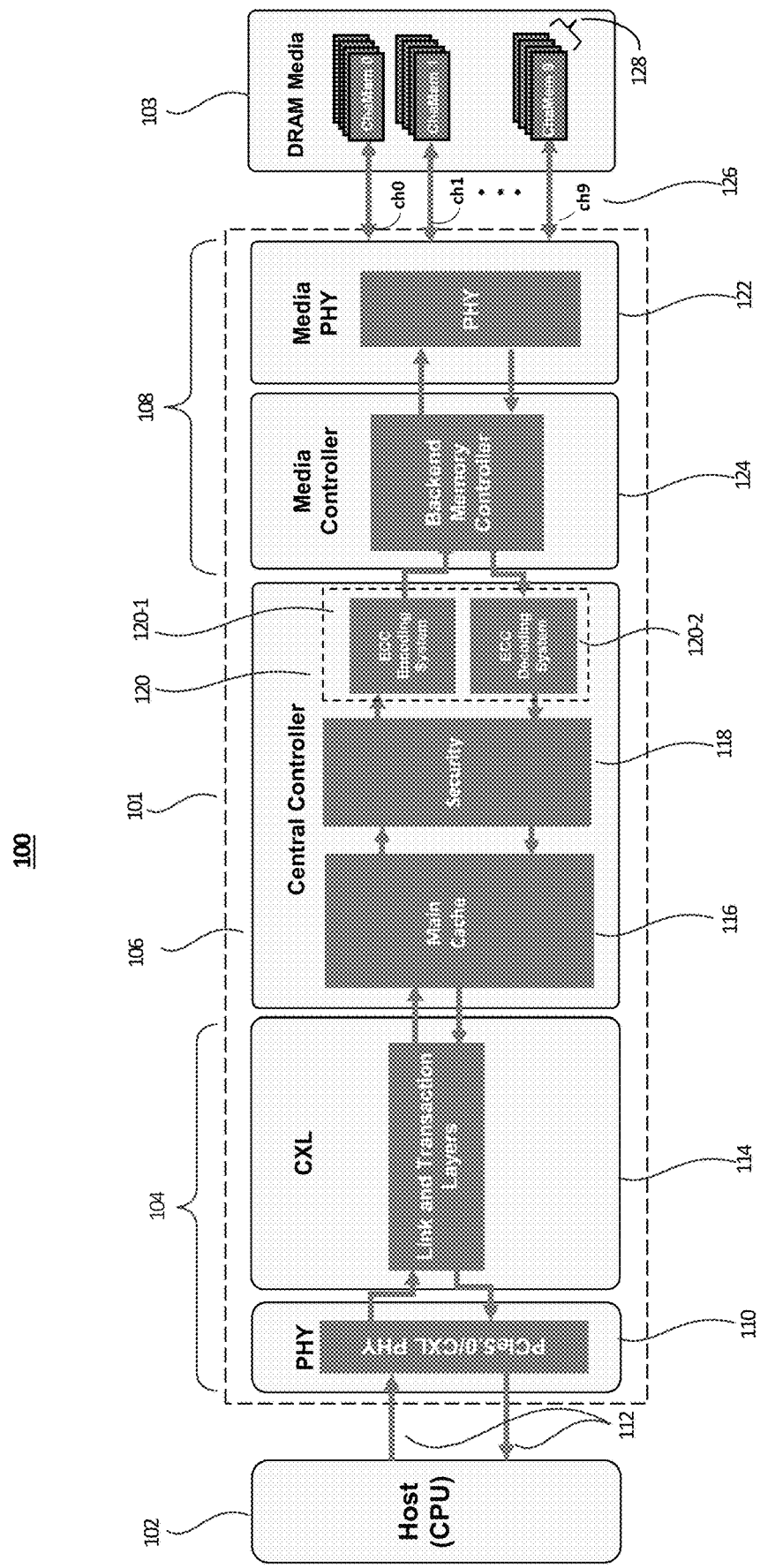
FIG. 1 illustrates a functional block diagram of a system including a host, a memory controller, and a memory array, according to an embodiment of the present disclosure.

FIG. 1 illustrates a functional block diagram of a system 100 including a host, a memory controller, and a memory array, according to an embodiment of the present disclosure. For example, the system 100 includes a memory controller 101 for managing transfer of data, commands, and/or instructions between a host 102 and a memory device, such as DRAM media 103.

The memory controller 101 includes a front end portion 104, a central controller 106, and a backend 108. By way of example, the host 102 can be a central processor unit (CPU), personal computer, mobile telephone, an Internet-of-Things (IoT) enabled device, or the like. The host 102 can include processing resources (e.g., one or more processors, microprocessors, or other type of controlling circuitry) capable of accessing the DRAM media 103.

The front end portion 104 may include a physical interface 110 to couple the memory controller 101 to the host 102 through input/output (I/O) lanes 112. Interface management circuitry 114 manages the interface 110. For example, the interface 110 can include suitable protocols (e.g., a data bus, an address bus, and a command bus, or a combined data/address/command bus). Such protocols may be custom or proprietary, or may be standardized, such as the peripheral component interconnect express (PCIe), CXL, Gen-Z, cache coherent interconnect for accelerators (CCIX), or the like.

The central controller 106 can control, in response to receiving a request from the host 102, performance of a memory operation, such as reading/writing data from/to the DRAM media 103. The central controller 106 can include a main cache 116 to store data associated with performance of memory operation, and/or a security component 118 to encrypt the data before storage in the DRAM media 103.

The central controller 106 includes an ECC controller 120 to detect and correct n-bit errors that may occur in the data stored in the DRAM media 103. The ECC controller 120 includes an ECC encoding system 120-1 and an ECC decoding system 120-2. The ECC encoding system 120-1 executes encoding operations to encode the data written to the DRAM media 103. The ECC decoding system 120-2 executes decoding operations to decode the data read from the DRAM media 103.

Users are increasingly requiring that certain DRAM products have higher reliability so that a host, such as the host 102, can successfully retrieve the stored data. ECC techniques, such as chipkill noted above, are implemented to increase DRAM reliability. ECC chipkill protects data against any single DRAM component failure. As an example, an ECC technique may require additional parity bits to be stored, in addition to original user data bits. The need to store additional ECC parity bits, however, reduces the media capacity available to the host 102, increases overall costs, and increases power usage.

By way of background, a competing requirement is the ability to store other information, in addition to the ECC parity bits, on top of the original user data. CXL products, for example, are required to store metadata in certain circumstances. Thus, the need to store metadata conflicts with the need to store the additional ECC parity bits. Therefore, less costly ECC solutions (in terms of parity and die overhead) are needed to correct errors when an entire device fails or an entire read access to a device is corrupt.

An optimal ECC solution, in accordance with the embodiments, leverages (i) the ability to correct more erasures than random errors and (ii) the fact that most errors will likely be confined to a specific DRAM component. Stated another way, the odds of multiple DRAM components failing simultaneously is very low. Additionally, if the failure is a UE, determined via an ECC algorithm, then it is also likely the fault generating the UE is bounded to one faulty DRAM component.

ECC schemes capable of correcting errors using parity symbols, such as RS codes, are well known to those of skill in the art. By way of background, RS codes include a group of error-correcting codes that operate on a linear block of data called codewords. Codewords are of (n) length and include (k) data symbols, along with parity check symbols added to the data symbols, each symbol comprising(s) bits. There are (n)-(k) parity symbols. The parity check symbols enable RS codes to detect and correct multiple symbol errors.

For example, using 2(t) parity symbols, RS codes can correct combinations of erasures (v) and random errors (e) such that $(v)+ [(e)/2] \leq (t)$. Additionally, a codeword may span (j) devices, with (x) symbols per device such that the entire codeword $(n)=(x)*(j)$ symbols.

As used herein, an erasure means that a specific symbol location for one or more bits is known to be corrupt (i.e., unknown error value). The location of a random error is unknown. All that is known is that data corruption occurred. As a result, if the location of the error is known, it is possible to correct more erasures than random errors. In fact, consistent with the expression above, twice as many erasures (v) can be corrected as random errors (e). More specifically, an RS based decoder can correct up to (t) errors or up to 2(t) erasures.

Conventional ECC techniques are generally unable to efficiently detect and correct failures in certain circumstances. Included in these circumstances are cases where an entire device fails and/or cases involving all bits in a given read from a single device. These circumstances are exacerbated when the ECC scheme is constrained to (e) errors being treated as random errors (i.e., no erasure information). These constraints cause the decoder to either indicate a failure, or correct to the wrong codeword, resulting in SDC.

ECC solutions constructed in accordance with the embodiments, however, remedy this and other deficiencies.

In the embodiments, knowledge that faults leading to the corruption of multiple symbols in a codeword are likely confined to a single DRAM component significantly reduces the search space (i.e., possible error location combinations) required to identify the error location, compared to other ECC techniques. ECC solutions, in accordance with the embodiments, also decrease decoding delays and reduce the occurrence of false decoding errors.

Returning to FIG. 1, DRAM devices, such as the DRAM media 103, usually consist of identical DRAM components. Data may be stored to, and accessed from, multiple components in parallel. In these arrangements, the failure of any one component may corrupt data and result in errors. The ECC controller 120 implements an iterative decoding technique that corrects DRAM device failures and ultimately reduces the likelihood of such errors.

Using exemplary RS coding principles, the ECC encoding system 120-1 stores original user data (e.g., data bits) in memory in the form of a linear block code, known as a codeword. The codeword includes the original payload or user data bits, along with a set of ECC parity bits used to check for errors in the data bits. The host 102 may later request the memory controller 101 to retrieve the stored user data. In response, the ECC decoding system 120-2 reads the codeword from the DRAM media 103, decodes the codeword to correct any errors, and provides decoded data bits to the host 102.

The backend 108 may include multiple physical layer (PHY) 122 and a media controller 124 to drive an interface 126. The interface 126 couples the memory controller 101 to channel memory devices (ChaMem0-ChaMem9) within the DRAM media 103. By way of example only, and not limitation, the interface 126 includes data/parity channels (ch0-ch9) respectively corresponding to the channel memory devices (ChaMem0-ChaMem9). In one or more embodiments, the channels (ch0-ch9) may include low-power double data rate 5 (LP5) channels.

The channel memory devices (ChaMem0-ChaMem9) may be arranged in a plurality layers of memory regions forming logical memory ranks 128, each rank including one or more die (i.e., components) therein. As understood by those of skill in the art, a memory rank includes a set of DRAM chips that can be accessed simultaneously via a common chip select.

Figure 2:
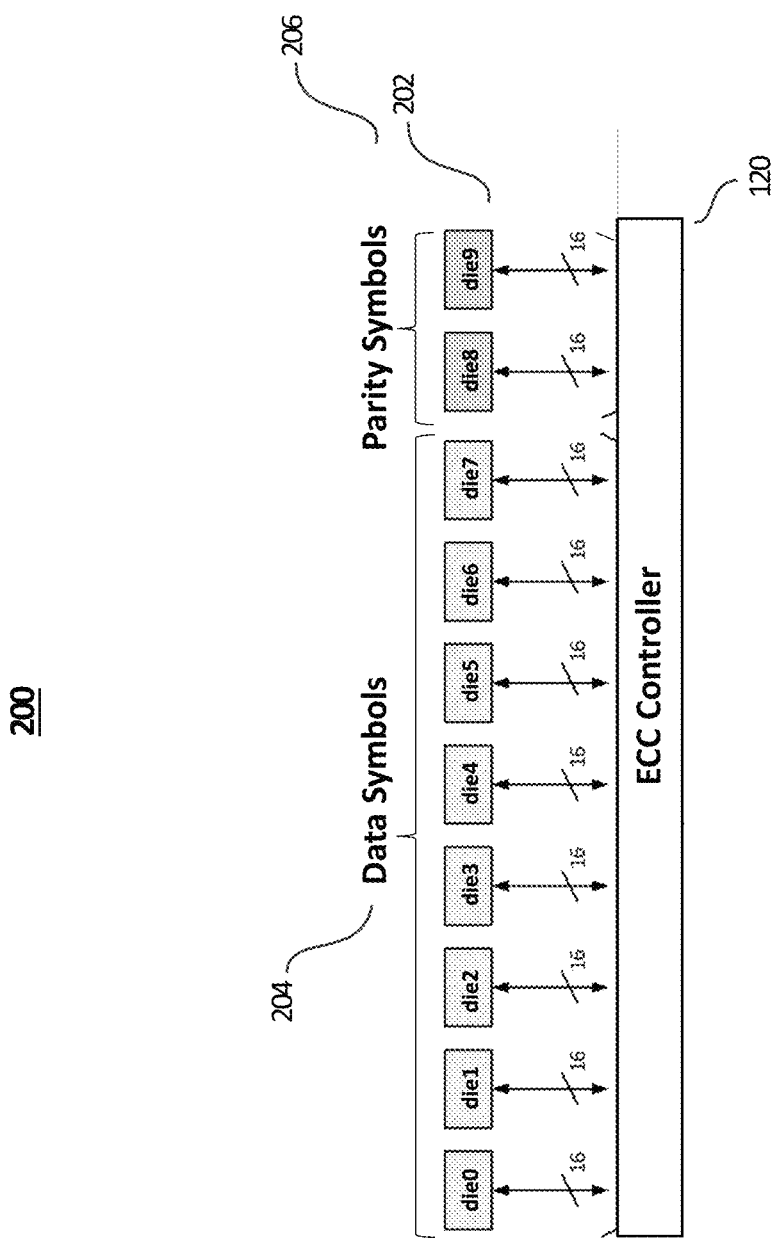
FIG. 2 illustrates an example of how symbols from a single Reed-Solomon (RS) codeword may be distributed across a plurality of DRAM devices in accordance with the embodiments.

FIG. 2 illustrates an exemplary scheme 200 of the data and parity channels (ch0-ch9) depicted in FIG. 1. Specifically, FIG. 2 illustrates DRAM memory device components 202 (die0-die9) within the channel memory devices (ChaMem0-ChaMem9), respectively. The DRAM device components (die0-die9) 202 represent one of the memory ranks 128 and are electrically coupled, at least indirectly, to the ECC controller 120. In FIG. 2 where (n) equals 44, one ECC codeword includes data from each of the DRAM device components (die0-die9) 202.

In the scheme 200, a respective portion of the ECC codeword is stored in each of the device components (die0-die9) 202. For example, eight device components (die0-die7) contain data symbols 204 and the remaining three device components (die8-die9) contain parity symbols 206. In the example of FIG. 2, each of the device components (die0-die9) 202 contributes (4) symbol bits to the ECC codeword, illustrated in greater detail in FIG. 3.

Figure 3:
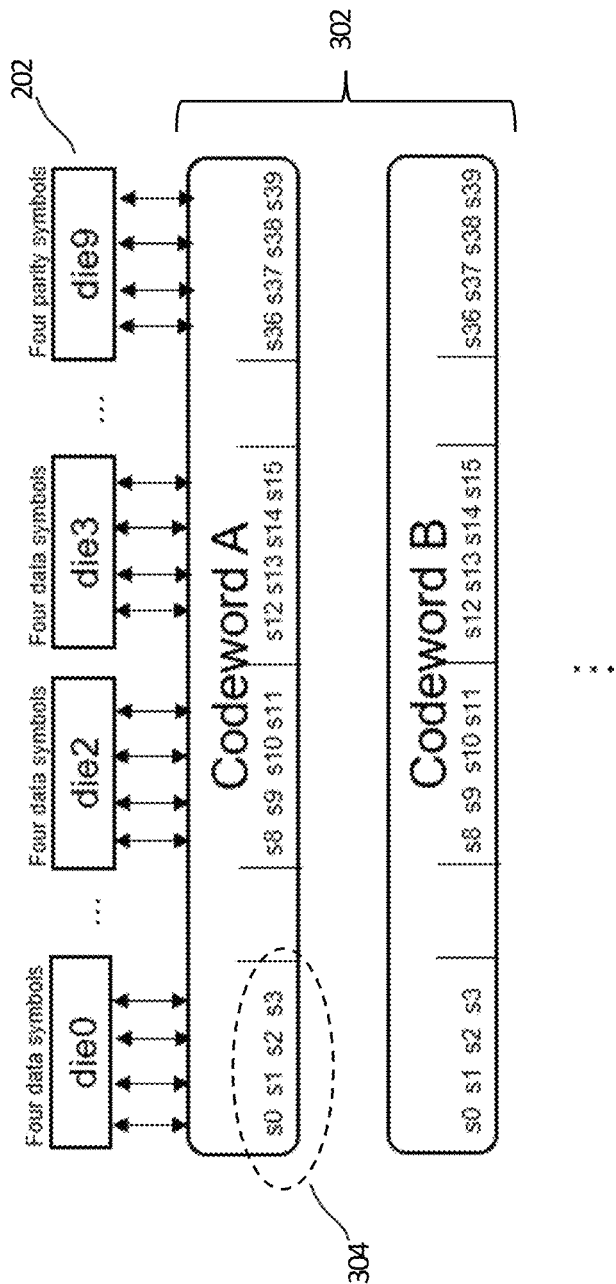
FIG. 3 illustrates exemplary data and parity channels within the computing system depicted in FIG. 1.

FIG. 3 is an illustration of an exemplary construction 300 depicting a relationship between the ECC codeword symbols with the data/parity channels (ch0-ch9). In FIG. 3, each of exemplary ECC codewords 302 (e.g., codewords A-B) includes four symbol bits 304 (e.g., s0-s3) from each of the device components (die0-die9) 202. That is, each of the ECC codewords A-B includes 10 symbols (40 bits total): 4 bits from each of the device components (die0-die9) 202.

By way of example, codeword A includes data bits (32 total) and parity bits (8 total) from each of the device components (die0-die9) 202. That is, codeword A is comprised of data symbols s0-s31 and parity symbols s32-s39. The data symbols s0-s31 and parity symbols s32-s39 correspond to the device components (die0-die9) 202, respectively. From a different point of view, data symbols s0-s3, in each of the ECC codewords 302, is associated with the device component die0.

Figure 4:
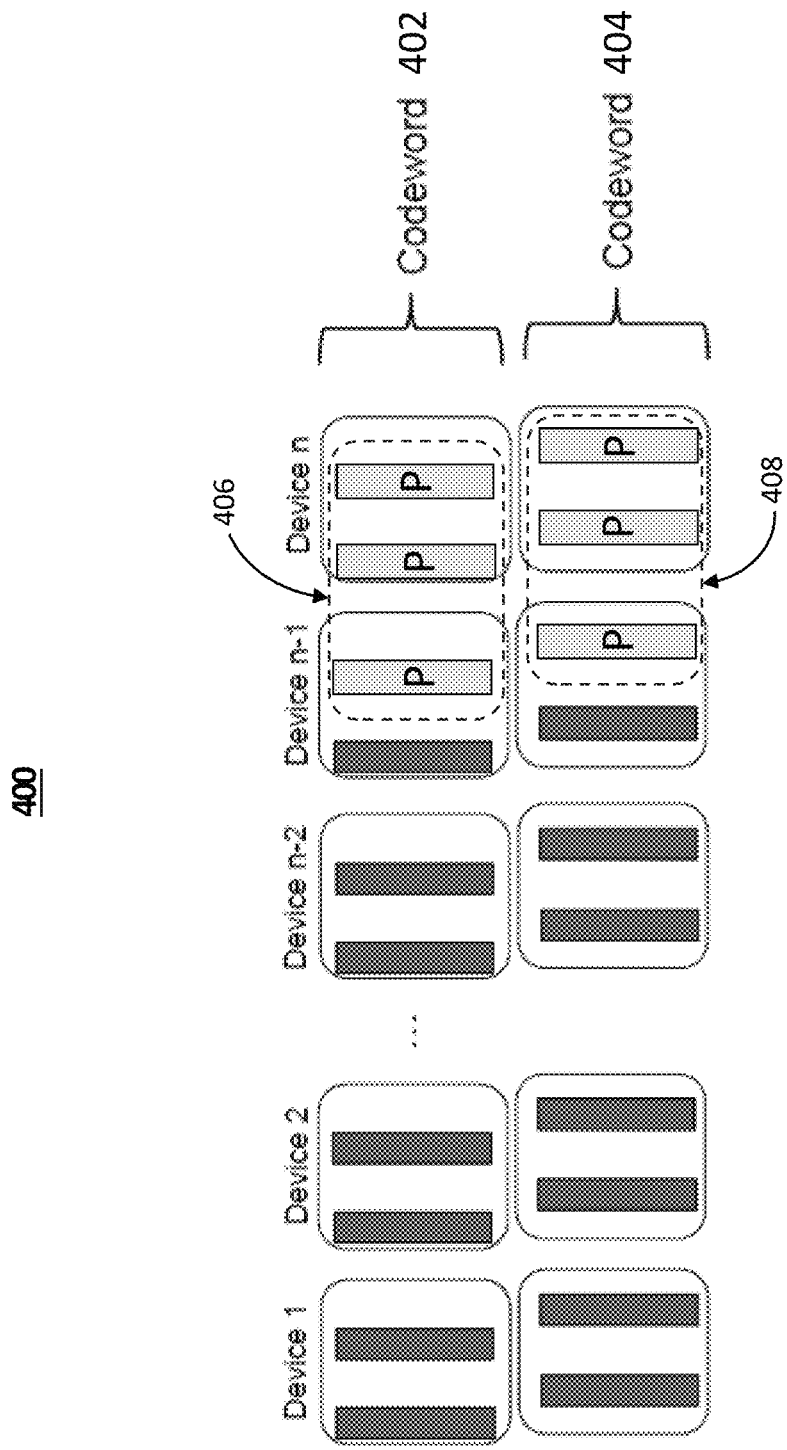
FIG. 4 illustrates an exemplary approach to homogeneously interleaving with burst error correction (BEC) decoding, in accordance with the embodiments.

FIG. 4 illustrates an exemplary approach 400 to homogeneously interleaving with BEC decoding, in accordance with the embodiments.

For context, the single-pass ECC solutions described herein focus on bursts of symbols as opposed to bursts of bits in a symbol. For example, if the fails form a burst across multiple symbols such that they are all sequential in order, that information can be used to decode more efficiently and more effectively than standard decoding. Because in standard RS decoding, the corrupt symbols could be anywhere in the codeword. Thus, if two random symbols can be corrected, there could be two random symbols anywhere.

As such, the embodiments trade the ability to correct random symbols for the ability to correct more symbols. That is, if the errors cannot be randomly distributed across the whole codeword then they must be basically sequential. A byproduct of this concept is that all the symbols are adjacent within a single physical device. And more errors can be corrected with the addition of this constraint.

In the embodiments, a BEC for RS solution is implemented based on modifications to the well-known Berlekamp-Massey Algorithm (BMA). As used herein, this modified BMA solution is designed to correct errors corrupting all symbols in a codeword from a single device with less parity than required for random error correction. The inventors recognize that there is always a finite probability for a decoding failure to occur. The modified BMA solution presented herein attempts to optimize this probability to make it acceptable.

One of the modifications to the BMA applies a modified version of another well-known algorithm proposed by Y. Wu (see "*Novel Burst Error Correction Algorithms for Reed-Solomon Codes*," IEEE Trans. Info. Theory, 58, 2012.). The combined BMA and Wu modifications implemented in the embodiments shall be referred to herein as the modified BMA/Wu technique. The modified BMA/Wu technique is a function of the exemplary expressions (A)-(D) and process steps (1)-(6) as shown below:

(A) (Pre-) Compute Modified ELP, $$\overline{\Lambda}^{(p)}(x) \triangleq \prod_{i=-(p-1)}^{0} (1 - \alpha^i x)$$

(B) Find roots of $\Gamma(x)$ $$\Gamma(x) \triangleq S_{r-1}\overline{A}_0^{(r-1)} + S_{r-2}\overline{A}_1^{(r-1)} \cdot x + \ldots + S_0\overline{A}_{r-1}^{(r-1)} \cdot x^{r-1}$$

(C) Compute ELP $$A(x) = \overline{\Lambda}^{(f)}(\alpha^{s+f-1}x)$$

(D) Correcting a Long Burst,
  a. Precompute the coefficients of $\overline{\Lambda}^{(r-1)}$ (x)
  b. Compute syndromes $S_0, S_1, S_2, \ldots, S_{r-1}$.
  c. Apply the Berlekamp-Massey algorithm. If successful, then stop
  d. Compute the coefficients of $\Gamma(x)$ as defined in (9).
  e. Apply the Chien search to $\Gamma(x)$ to obtain the shortest single-burst by tracking the longest consecutive root sequence. Record the end position of the desired shortest burst.
  f. Compute burst error magnitudes using Forney's formula or re-encoding.

In the modified BMA/Wu technique above, instead of calculating the standard error locator polynomial (ELP), the embodiments compute a modified ELP at expression (A). The modified ELP, calculated within the ECC decoding system 120-2, accumulates information about the error signature for later use in downstream paths within the ECC decoding system 120-2.

The modified BMA/Wu ELP technique includes terms that depend on the number of burst errors allowable. The technique has a complexity O (rn), where (r) is parity symbols and (n) is codeword size. Coefficients of the modified ELP are combined with calculated syndromes (calculated within the ECC decoding system 120-2—described below). As understood by those of skill in the art, syndromes are values that denote error patterns in a received codeword-used to identify and correct errors in received data. The syndromes values are used to generate a gamma function [$\Gamma(x)$]. For example, the gamma function [$\Gamma(x)$] contains the pre-compute modified ELP values [expression (A) above] multiplied by factors from the syndrome. The syndrome values are determined on a per codeword basis, where non-zero syndrome values indicate the presence of errors.

By way of background, polynomial roots represent values where the polynomial function is equal to zero. In the instant application, the roots of the gamma function $\Gamma(x)$ [expression (B)] provide the error locations. The roots of the gamma function $\Gamma(x)$ contain the pre-compute modified ELP values above, multiplied by factors from the calculated syndrome values. Thus, once the syndrome values are determined, standard ELP values can be determined [expression (C) above]. A long burst can be corrected using expression (D) above and process steps (1)-(6)

Using this approach, the error location equations can be simplified, in reduced in number, by assuming the errors are all in adjacent symbols. This may complicate the process of correcting errors that are not physically adjacent. However, chipkill concepts, approximated herein, rely on the assumption that there is one device containing all the failing symbols which is physically one of the objectives of the embodiments.

In the embodiments, a single burst has (r)-(f) consecutive roots, where (r) is the number of parity symbols and (f) is the burst length. The standard ELP can be computed from the modified ELP after the start of the burst has been identified. Error magnitudes can be computed using another well-known approach called Forney's algorithm, as performed system person in standard RS decoding.

The modified BMA/Wu technique enables decoding beyond the standard RS bound: floor [(n−k)/2]. Standard RS decoding is used first, and BEC is only attempted if standard decoding fails. The approach corrects burst errors of (f)= (r)−1 or less. For single device correction, #parity symbols are needed, r> #symbols per device.

As noted above, a finite probability of a decoding failure occurring exists. The probability depends on number of parity symbols and burst length and improves exponentially with distance between (f) and (r). Cases, such as DDR4 18×4, have relatively fewer parity symbols and bursts that are near maximum (r) possible, resulting in high decoding error probabilities.

There is at least one saving grace with respect to the decoding failure finite probability: codewords associated with the system 100 are short versus natural code length (36 symbol vs 2^8−1=255 symbol). Thus, many error locations can be ignored, which improves decoding probability. Results can be further improved by comparing potential error location candidates across codewords. These additional improvements rely on an assumption that only a single device is source of errors in both codewords. Additional improvements may also occur by eliminating non-overlapping potential error patterns.

Thus, the embodiments provide another way to improve performance by reducing the UE probability by combining information across codewords or across codewords from either the same read attempts (if there are multiple code words in the same single cache line) or across multiple cache lines and multiple reads.

Returning back to FIG. 4, a configuration 400 illustrates an exemplary codeword 402 and a codeword 404, having (6) parity symbols 406 and 408, respectively. The codewords 402 and 404 are interleaved using BEC with a single cache line, and a single read access. In the example configuration 400, the separate codewords 402 and 404 represent the division of every other symbol being divided into separate codewords.

The concept illustrated in the configuration 400 is that attempts can be made to decode each of the codewords 402 and 404 individually. If there are two possible solutions on the codeword 402 and two solutions on the codeword 404, the two solutions can be compared to determine which solutions overlap (explained in greater detail below in relation to FIG. 8). The overlapping solutions are considered to be valid solutions. However, if all of the solutions overlap, the solutions are determined to be invalid, or spurious. This approach reduces overhead and relies on a statistical probability argument. That is, the configuration 400 assumes that it would be unlikely that both the first codeword 402 and the second codeword 404 would have the same spurious solutions such that all the solutions would overlap and result in a failure.

On the other hand, this approach does not require both the codeword 402 and the codeword 404 to have failures. By way of example only and not limitation, if the codeword 402 has two failed symbols from one device and the codeword 404 has no failures, the codeword 402 can still be corrected with some probability. Although the configuration 400 depicts two interleaved codewords, the same approach can be used for a single codeword without interleaving and without comparing between different codewords.

This approach can also work with more than two codewords (e.g., 3, 4, or more) where the codewords result from one read access, or multiple read accesses. Of particular significance, however, is the ability to generate a list of possible error locations (roots of a polynomial) and compare these locations across interleaved codewords to remove false locations. Once the failing device is known, the start position and length of the burst can be calculated separately for each codeword. It is not necessary for the specific failing symbols to be the same across codewords, just from the same failing device. With this information, the ELP can be calculated and error magnitudes determined using standard RS decoding approaches (e.g., Forney's algorithm) well known to those of skill in the art. An additional symbol check may be performed on any partially filled data symbols (i.e., for metadata) to reduce the probability of mis-correction.

Thus, the configuration 400 of FIG. 4 indicates that standard RS decoding cannot recover single device failures on either of the codewords 402 or 404 above. However, BEC as described herein, can correct single device failures on both codewords 402 and 404. Critically, BEC can recover single device failure on one codeword (e.g., 402) even if no failures occurred on the other codeword (e.g., 404). This feature is an advantage over conventional approaches.

Figure 5:
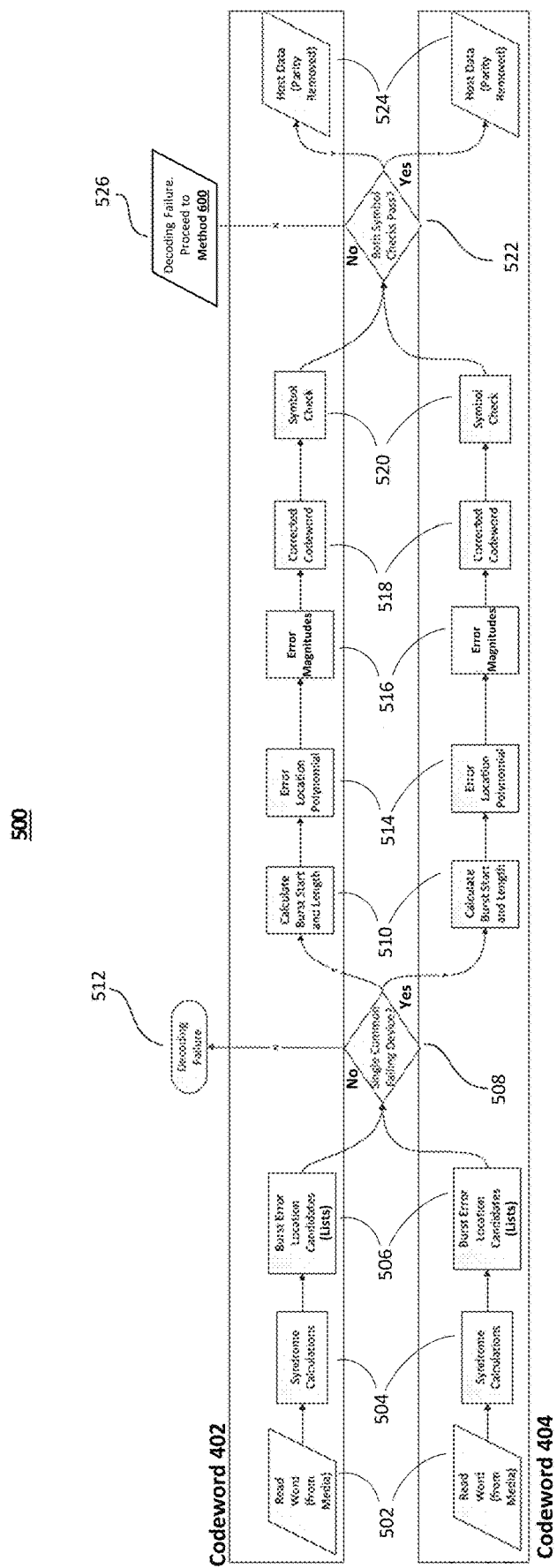
FIG. 5. illustrates a flowchart of an exemplary method of practicing one or more of the embodiments of the present disclosure.

FIG. 5 illustrates a flowchart of an exemplary method 500 of practicing one or more of the embodiments of the present disclosure. In the embodiments, the action blocks depicted in FIG. 5 are performed on each of the codewords 402 and 404 in an interleaved manner. For example, to initiate the process described above, read words for the codewords 402 and 404 are received in one or more ECC decoding systems (e.g., the ECC decoding system 120-2) from the media 103 (or cacheline) in block 502. In block 504, the syndromes are calculated, as described above.

The modified BMA/Wu technique is performed, in the manner described above, to generate candidate error locations/failing devices for each of the codewords 402 and 404, in block 506. In the embodiments, the decoding process actually generates a list of multiple candidate locations. By performing the interleaving, the lists from both codewords 402 and 404 can be compared and the intersections of those comparisons can be used to detect valid error locations. Whatever common devices fail provides some advantage in terms of reducing the probability of getting a decoding failure. A decoding failure occurs if there are more candidates where it is difficult to determine which candidate is correct. Performing the interleaving provides an ability to compare between different codewords.

More specifically, if there is only one candidate, as determined in decision block 508, the process continues to block 510. However, if there are multiple candidates, either a decoding failure is declared (block 512) or the solutions are compared with each other to determine which solution is the true candidate or the true failure location. Assuming there is a single true candidate, or the candidates can be narrowed to a single location, the burst start position and the burst length are calculated at block 510. From the burst start position and length calculations, the ELPs can be derived at block 514.

Error magnitudes are computed separately, using standard RS decoding approaches, at block 516 and corrected codewords are generated at block 518. At block 520, an additional symbol check is performed where extra symbols (e.g., metadata) are used as extra bits, in what is normally a data symbol, for validation purposes to reduce mis-correction probability. If both symbol checks pass, as determined at block 522, the process continues to block 524 where parity is removed and the data is passed to the host 102. If both symbol checks did not pass, a decoding failure is declared in block 526 and the method 500 proceeds to method 600 (see FIG. 6). In the method 500, each of the blocks 502-524, that are performed on both of the codewords 1 and 2, are performed in a substantially parallel manner.

Figure 6:
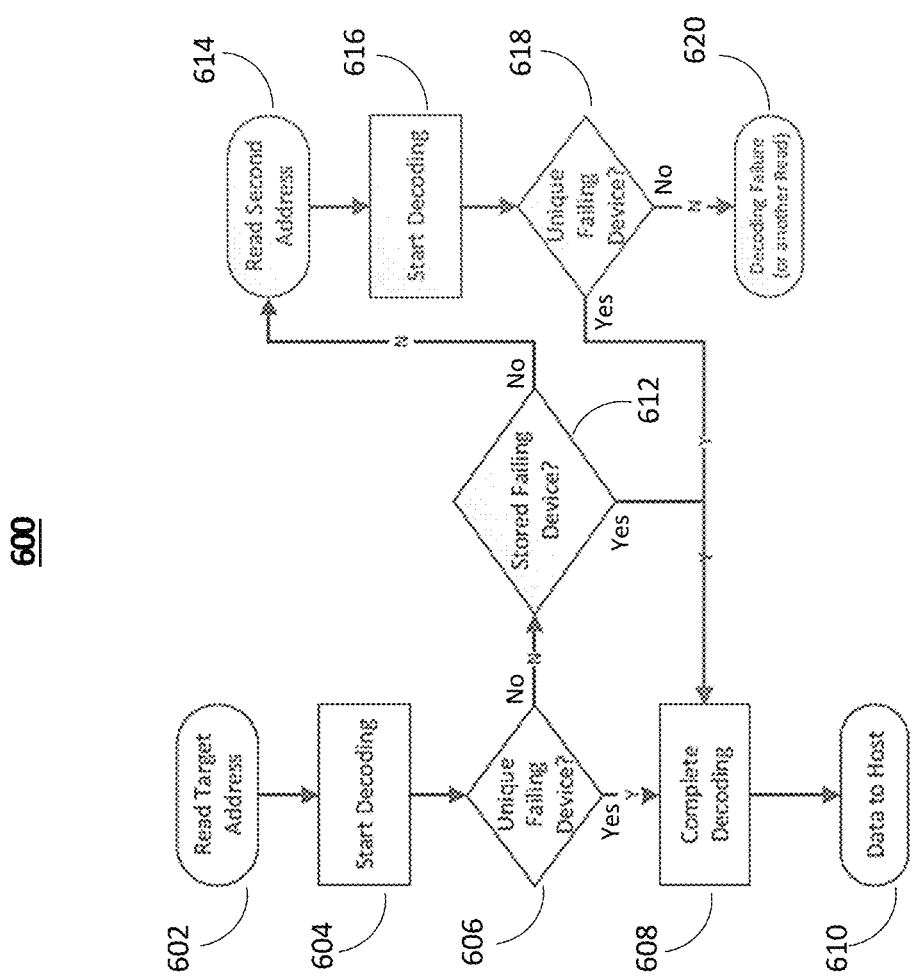
FIG. 6 illustrates a flowchart of another exemplary method of using reads on additional addresses to mitigate decoding failures, in accordance with the embodiments.

FIG. 6 illustrates a flowchart of another exemplary method 600 of using reads on additional addresses to mitigate decoding failures, in accordance with the embodiments. The RS decoding processes described above (e.g., method 500) enables interleaving from one read address, where a read command can be executed for an address to retrieve data. The retrieved data can then be split into two codewords for performance enhancement reasons. However, it is possible that a codeword could be read that cannot be corrected, resulting in a UE at block 526.

When the block 526 UE occurs (FIG. 5), the method 600 pools the candidate failing device locations across the codewords (e.g., codewords 402 and 404) to improve the chances of determining the true failing device location. In this instance, the method 600 provides the ability to read another codeword from the same address line (e.g., that same row) that produced the UE and decode the line successfully.

After this subsequent successful decoding, the failed device or the device, that triggered the error is in the codeword, can be identified. This information may then be used to decode the first read. Accordingly, the method 600 provides another mechanism to avoid UEs by utilizing additional information beyond the boundaries of the single failed read address.

The method 600 commences by reading a target address (e.g., the same row) derived from the failure or UE of block 526 of the method 500, as described in block 602. Decoding begins in block 604 to solve the original decoding problem. In decision block 606, a determination is made whether there is a unique failing device.

For example, as the decoding process began in block 604, a check can be performed to determine whether it is already known if a device has failed. This determination is needed because of the finite chance that both codewords (e.g., codewords 402 and 404) could produce the same candidate lists with more than one device. This occurrence will result in a decoding failure. Since these lists of failing locations are created, the lists can be cross-referenced, for example, with a list of failing locations.

This cross-referencing may facilitate recognition of a device previously known to have failed and/or been identified on a previous list. However, if the failing device is unique, the method proceeds to block 608 for completion of decoding. After completion of decoding, the decoded data is sent to the host 102 at block 610.

If the result of the decision block 608 is that the failing device is not unique, the method proceeds to block 612 to determine whether the failing device location was stored. For example, a previous failing address can be stored, to mark a single device as failed, and that information may later be used to perform a second read.

If the device location is stored, the method 600 proceeds to the block 608 for completion of the decoding process. On the other hand, if the location of the failing device is not stored, the 600 proceeds to block 614 where a second address (i.e., another address from the same row as the target address) is read to help resolve the failing device's identity. Either the second read could be used to identify the failing device itself or the candidate lists from both reads may be pooled to identify the failing device.

If the location of the failed device is determined, the method 600 proceeds to block 616 where the decoding process commences for the failed device address identified in block 614. At decision block 618, a determination is made whether there is a identified failed device is unique. If the failed device is unique, the method proceeds to blocks 608 for completion of the decoding process. If a unique failing device is not identified, the method proceeds to block 620, where a decoding failure is declared (or another read is performed). The method 600 enables use of the approach of the method 500 to help improve the UE rates, of the decoding process, by leveraging additional addresses from the same row of the initial failed device. This approach is applicable for both interleaved and non-interleaved decoding approaches.

As an alternative to, or in addition to the method 600, a failing device could be stored for future use by the techniques described above. A candidate failing device list could be compared to the stored values, resulting in two options. The stored device is found in the candidate list (even if the list had only one device). Alternatively, the stored device could be used only when the candidate list had multiple candidates.

Figure 7:
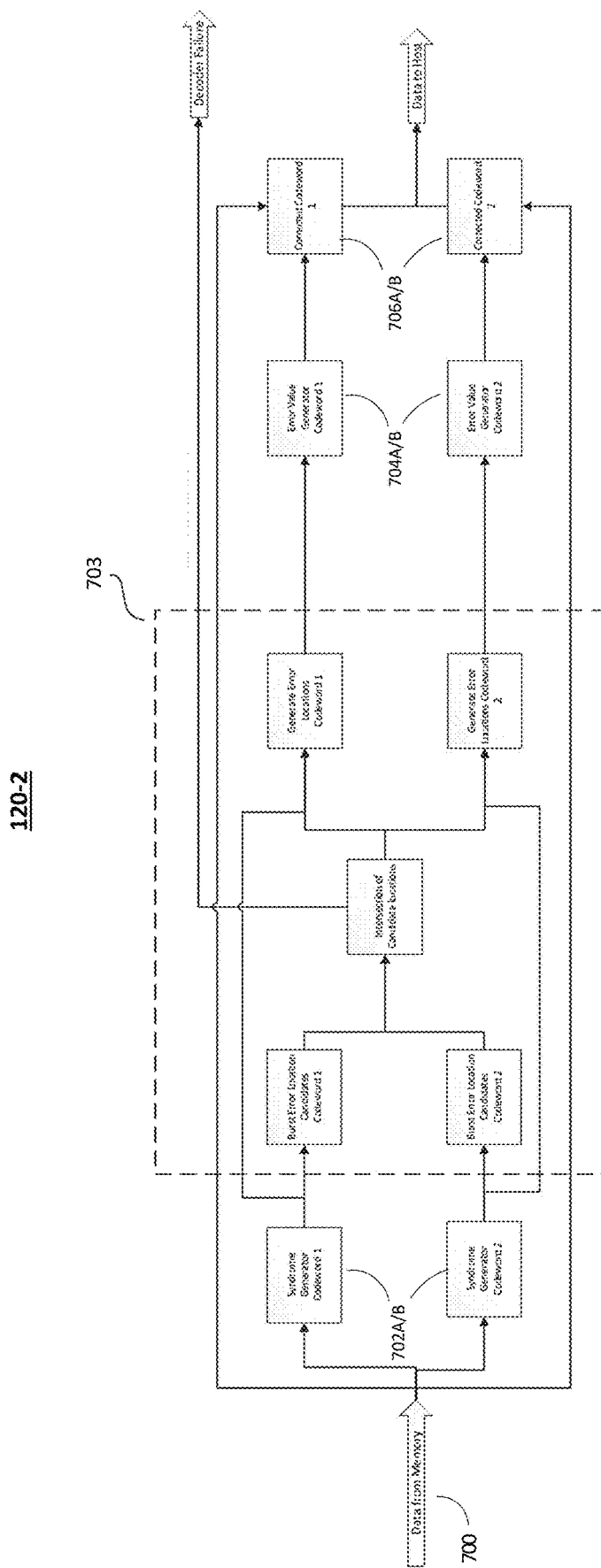
FIG. 7 is a general illustration of the exemplary ECC decoding system depicted FIG. 1, in accordance with the embodiments.

FIG. 7 is a detailed illustration of the exemplary ECC decoding system 120-2 of FIG. 1, in accordance with the embodiments. The ECC decoding system 120-2 includes syndrome generators 702 that respectively receive interleaved codeword 1 and codeword 2 data 700 from the memory 103. The codeword 1 and codeword 2 data 700 is split into separate paths for input to syndrome generators 702A/B that respectively receive interleaved codeword 1 and codeword 2 data 700 from the memory 103 and calculate syndromes. A non-zero syndrome value indicates an error in the received codeword. The syndrome value is an intermediate error correction step for identifying the location of a single error in the codeword. Outputs of the syndrome generators 702A/B are provided to burst error correction logic 703, the details of which are discussed in greater detail in relation to FIG. 8, below.

Figure 8:
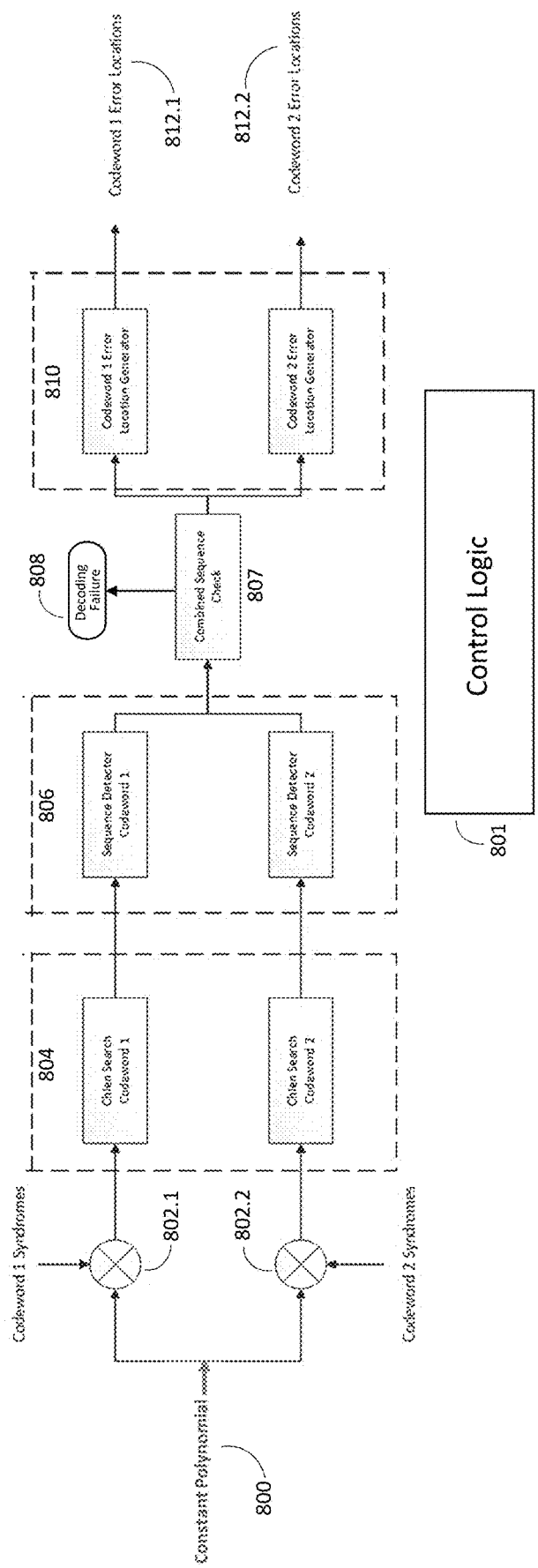
FIG. 8 is detailed illustration of the BEC logic depicted in the exemplary ECC decoding system of FIG. 7.

FIG. 8 is an illustration of burst error correction logic 703 constructed and arranged in accordance with the embodiments. In FIG. 8, a constant polynomial 800 is introduced, the value of which depends on various factors, such as the actual symbols used, for example, within the ECC controller 120, and the number errors the system is trying to correct, etc. And although this can be implemented in software or firmware, the constant polynomial 800 is a constant value typically implemented in hardware.

Under operation of control logic 801, the constant polynomial 800 is multiplied by the syndromes of codeword 1 and codeword 2 in multipliers 802.1 and 802.2, respectively over an appropriate field. This operation produces a new polynomial for each of codewords 1 and 2. Thus, the new codeword polynomial is a product of codeword 1 and codeword 2 syndromes and the constant polynomial 800.

Search engine 804 includes search engine logic for performing a search individually for each of the new codeword polynomials for codeword 1 and codeword 2. The search derives respective error locate polynomials (ELPs). The goal is to determine the roots of each of the ELPs. In essence, the search assists in determining the roots of each of the new codeword polynomials over a given field. The search may be a Chien search, known to those of skill in the art. However, the embodiments of the present disclosure are not limited to a Chien search.

The output of the search engine 804 will be a plurality of roots for each of the codewords 1 and 2. That is, when errors are present, there will be more than one root for codeword 1 and codeword 2. This process is attempting to generate sequences of roots, consecutive roots for codeword 1 and for codeword 2. For example, when analyzing corresponding symbols, the first element may be a root, the second element may be a root, and the third element may be a roots, but not the fourth. Thus, in this example the following pattern would emerge: [1 1 1 0].

The precise desired pattern or sequence will depend on the exact number of fails of interest and would have been determined beforehand and designed into the decoder chip during manufacturing. For that reason, a sequence detector 806 is provided to detect these patterns in the plurality of roots for codeword 1 and codeword 2. That is, the sequence detector 806 includes logic modules for searching for root patterns in the form of sequences of roots. The sequences of roots corresponding to errors in interleaved codeword 1 and codeword 2 data 701 read from the memory 103. These patterns appear in the form of sequences of consecutive roots.

Accordingly, the sequence detector 806 determines the positions of where a sequence was detected in the plurality of roots of each of the codewords 1 and 2 output from the search engine 804. Instead of looking across all the available patterns, the sequence detector 806 will indicate, for example, in a binary based numbering system (based on user preferences) and within a string of values, fails were detected at locations (3) and (9) in codeword 1. Similarly, for example, fails were detected at locations (3) and (17) in codeword 2.

If syndromes are both zero, then no errors were detected and no correction is required. A pattern detector looks for sequential roots, and then uses this information to determine the error location. The patterns to match would depend on the number of symbols per device. For example, the decoder would correctly identify errors that occurred at the same location in both codewords. Although it could correct isolated errors on one codeword or the other, it cannot correct multiple symbol where the symbols are not from the same device.

Combined sequence check logic 807 will combine the two sequences of roots from codewords 1 and 2 respectively, to check for a valid sequence. More specifically, the sequence check logic 807 identifies the intersection of the two sequences in attempt to find just one value (i.e., a valid sequence) common to both codeword 1 and codeword 2. This one value represents the particular location that appeared as a valid fail on each of the codewords 1 and 2. Finding more than one valid sequence means that all the sequences are invalid, or spurious, and a decoding failure is declared, as indicated in block 808.

The sequence check performed by the combined sequence check logic 807 only applies when the sequences associated with the codewords1 and 2 have values. In the case where one of the syndromes had a zero value (meaning no errors were detected), this process would be bypassed.

The identified value for combined codewords 1 and 2 is output from the combined sequence check logic 807 and fed to an error location generator 810 to derive the respective error locations 812.1 and 812.2 in codeword 1 and codeword 2. The error locations 812.1 and 812.2 are a function of the starting position of the root in the sequence in codeword 1 and codeword 2 and are respectively provided as inputs to error value generators 704A/B in the ECC decoding system 120-2 depicted in FIG. 7.

Returning to FIG. 7, the error value generators 704A/B calculate or confirm the error values at known error locations and provide respective corrected codeword 1 and codeword 2 data to corrected respective codeword 1 and codeword 2 modules 706A/B. By way of example only, and not limitation, one approach for calculating the error values is based on the Forney algorithm. General operation of the Forney algorithm is well known to those of skill in the art. Accordingly, details of the Forney algorithm will not be provided herein.

The embodiments leverage an observation that RS codes are often considered to have burst error correction capabilities and that a sequence of adjacent bit errors, contained in a single symbol, can be corrected for the same cost as a single bit error in the symbol. The corresponding solutions described herein focus on adjacent symbol burst error correction and are relevant for chipkill/single device data correction techniques, since errors in multiple symbols from a single device can be considered a type of burst error. The solutions, among other things, correct errors that corrupt all symbols in a codeword from a single device with less parity than required for random error correction.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method comprising:
performing, in a plurality of memory components in communication with a controller, error correction code (ECC) decoding on first and second received codewords read from the plurality of memory components;
respectively calculating first and second syndromes for the first and second received codewords substantially in parallel;
respectively calculating first and second burst error location candidates for the first and second received codewords;
determining if combined results of the burst error location candidates identify a single common failing device; and
generating a burst start position and length of the single identified error location candidate for each of the first and second codewords.

2. The method of claim 1, further comprising calculating codeword 1 and codeword 2 error locate polynomials (ELPs) responsive to generated burst start positions and lengths.

3. The method of claim 2, wherein the ELPs are calculated in accordance with Forney's algorithm.

4. The method of claim 2, further comprising calculating error magnitudes for the codeword 1 and codeword 2 ELPs.

5. The method of claim 4, further comprising correcting codeword 1 and the codeword 2 responsive to the respective calculated error magnitudes.

6. The method of claim 5, further comprising determining whether each of symbols associated with each of the corrected codeword 1 and codeword 2 is valid.

7. The method of claim 6, further comprising, when each of the symbols associated with the corrected codeword 1 and codeword 2 is not valid, reading another address from a row of the invalid symbol.

8. A non-transitory computer readable medium having stored thereon computer executable instructions that, if executed by a computing device, cause the computing device to perform a method for use by a memory controller of a memory system including a plurality of memory components, the method comprising:

performing error correction code (ECC) decoding on first and second received codewords read from the plurality of memory components;
respectively calculating first and second syndromes for the first and second received codewords substantially in parallel;
respectively calculating first and second burst error location candidates for the first and second received codewords;
determining if combined results of the burst error location candidates identify a single common failing device; and
generating a burst start position and length of the single identified error location candidate for each of the first and second codewords.

9. The non-transitory computer readable medium of claim 8, further comprising calculating codeword 1 and codeword 2 error locate polynomials (ELPs) responsive to generated burst start positions and lengths.

10. The non-transitory computer readable medium of claim 9, wherein the ELPs are calculated in accordance with Forney's algorithm.

11. The non-transitory computer readable medium of claim 9, further comprising calculating error magnitudes for the codeword 1 and codeword 2 ELPs.

12. The non-transitory computer readable medium of claim 11, further comprising correcting codeword 1 and the codeword 2 responsive to the respective calculated error magnitudes.

13. The non-transitory computer readable medium of claim 12, further comprising determining whether each of symbols associated with each of the corrected codeword 1 and codeword 2 is valid.

14. The non-transitory computer readable medium of claim 13, further comprising, when each of the symbols associated with the corrected codeword 1 and codeword 2 is not valid, reading another address from a row of the invalid symbol.

15. A memory system comprising:
a plurality of memory components; and
a controller in communication with the plurality of memory components and configured to:
perform error correction code (ECC) decoding on first and second received codewords read from the plurality of memory components;
respectively calculate first and second syndromes for the first and second received codewords substantially in parallel;
respectively calculate first and second burst error location candidates for the first and second received codewords;
determine if combined results of the burst error location candidates identify a single common failing device; and
generate a burst start position and length of the single identified error location candidate for each of the first and second codewords.

16. The memory system of claim 15, further comprising calculating codeword 1 and codeword 2 error locate polynomials (ELPs) responsive to generated burst start positions and lengths.

17. The memory system of claim 16, wherein the ELPs are calculated in accordance with Forney's algorithm.

18. The memory system of claim 16, further comprising calculating error magnitudes for the codeword 1 and codeword 2 ELPs.

19. The memory system of claim 18, further comprising correcting codeword 1 and the codeword 2 responsive to the respective calculated error magnitudes.

20. The memory system of claim 19, further comprising determining whether each of symbols associated with each of the corrected codeword 1 and codeword 2 is valid.

\* \* \* \* \*